United States Patent [19]
Toda

[11] Patent Number: 5,603,106
[45] Date of Patent: Feb. 11, 1997

[54] ADJUSTABLE TRANSMISSION POWER CONTROL CIRCUIT

[75] Inventor: Yoshifumi Toda, Tokyo, Japan

[73] Assignee: Fujitsu Limited, Kawasaki, Japan

[21] Appl. No.: 500,526

[22] Filed: Jul. 11, 1995

Related U.S. Application Data

[63] Continuation of Ser. No. 38,064, Mar. 29, 1993, abandoned, which is a continuation of Ser. No. 578,231, Sep. 6, 1990, abandoned.

[30] Foreign Application Priority Data

Sep. 6, 1989 [JP] Japan ................................. 1-231059

[51] Int. Cl.⁶ ..................................................... H04B 1/04
[52] U.S. Cl. ............................ 455/126; 455/115; 455/127
[58] Field of Search ............................. 455/89, 115, 127, 455/103, 116, 126, 343

[56] References Cited

U.S. PATENT DOCUMENTS

| | | | |
|---|---|---|---|
| 4,654,882 | 3/1987 | Ikeda | 455/89 |
| 4,700,151 | 10/1987 | Nagata | 455/126 |
| 4,825,193 | 4/1989 | Siwiak et al. | 455/127 |
| 4,939,786 | 7/1990 | McCallum et al. | 455/127 |
| 5,193,223 | 3/1993 | Walczak et al. | 455/126 |

FOREIGN PATENT DOCUMENTS

| | | | |
|---|---|---|---|
| 0261967 | 3/1988 | European Pat. Off. | |
| 0261232 | 11/1987 | Japan | 455/127 |
| 1-154614 | 6/1989 | Japan | |
| 1-238331 | 9/1989 | Japan | |

OTHER PUBLICATIONS

WO-A-8404215, Oct. 25, 1984, (Varian Associates, Inc.), p. 4, line 29–p. 5, line 35; FIG. 2.
Patent Abstracts of Japan, vol. 10, No. 104 (E-397)(2161), Apr. 19, 1986 & JP-A-60-244107 (Nippon Denki K.K.), 4 Dec. 1985.

*Primary Examiner*—Edward F. Urban
*Attorney, Agent, or Firm*—Staas & Halsey

[57] ABSTRACT

A transmission power control circuit comprises a control data table in which digital data of a monitor voltage depending on a transmission power level for a plurality of values of transmission frequency and a plurality of values of transmission power are stored. A D/A converter converts selected values of the digital data to an analog signal as a reference voltage. The transmission power is controlled so that the monitor voltage becomes equal to the reference voltage.

8 Claims, 9 Drawing Sheets

ADJUSTABLE TRANSMISSION POWER CONTROL CIRCUIT

This application is a continuation, of application Ser. No. 08/038,064, filed Mar. 29, 1993, now abandoned, which is a continuation of application Ser. No. 07/578,231, filed Sep. 6, 1990, now abandoned.

BACKGROUND OF THE INVENTION

1. Field of the Invention

The present invention relates to a transmission power control circuit, more particularly, a transmission power control circuit which controls transmission power of a transmitter used in a mobile communication system such as an automobile telephone system, a portable telephone system, and the like.

2. Description of the Related Art

In a mobile communication system, transmission power of the mobile terminal is controlled in response to electrical field strength which varies with the distance between the mobile terminal and a base station and other conditions, to prevent the mobile terminal from transmitting needlessly, and to reduce power consumption of the mobile terminal.

In order to perform this function, a radio transmitter for the mobile terminal is provided with an automatic power control circuit (APC). The APC controls the amount of amplification of a power amplifier (PA) so that a monitor voltage corresponding to the transmission power of the PA becomes equal to a reference voltage corresponding to a required transmission power, and thus, the transmission power is controlled to be a required value. As the reference voltage can be discretely altered according to a digital control signal, the transmission power is controlled stepwise.

An AM detector for detecting the level of transmission power is provided in the PA, in order to generate the monitor voltage signal. If there is a certain deviation in the characteristics of elements used for the AM detector from standard characteristics, a different monitor voltage can be generated, and thus the level of the transmission power becomes incorrect. Therefore, the transmission power of the products is adjusted before shipping. The adjustment of the transmission power is carried out by altering values of reference voltages $V_1$ and $V_2$, which correspond to the minimum and the maximum transmission powers, respectively, with two variable resistors.

In the aforementioned conventional transmission power control circuit, another problem to be solved arises in the mobile communication system where a carrier frequency of the transmission wave is frequently changed in accordance with an assigned frequency channel. In this case, though the values of the reference voltages $V_1$ and $V_2$ are correctly adjusted for one frequency channel, the transmission power can be changed for another frequency, because there is a frequency dependency in the characteristics of the elements forming the AM detector.

Additionally, there can be dispersion in the frequency dependency of the elements. Therefore, it is also desirable to overcome this problem.

Moreover, in the aforementioned conventional transmission power control circuit, the level of the transmission power can be incorrect in a medium range even if the maximum and the minimum transmission power are correctly adjusted.

SUMMARY OF THE INVENTION

It is an object of the present invention to provide a transmission power control circuit which is not affected by the frequency dependency of the elements.

It is another object of the present invention to provide a transmission power control circuit which can be adjusted for all transmission power levels to be selected.

In accordance with the present invention, there is provided a transmission power control circuit comprising control data table means for storing digital values of monitor voltage which are output from a power amplifier depending on a transmission power level of the power amplifier for a plurality of values of transmission frequency, control means for selecting one of the digital values stored in the control data table means in accordance with a specified value of the transmission frequency, and for outputting a selected digital value, D/A conversion means for converting the digital value to an analog signal as a reference voltage, and power control means for controlling an amplification factor of the power amplifier so that the monitor voltage which is output from the power amplifier becomes equal to the reference voltage.

DESCRIPTION OF THE PREFERRED EMBODIMENTS

Before describing the preferred embodiments according to the invention, examples of aforementioned related art are given with reference to the accompanying drawings.

Figure 1:
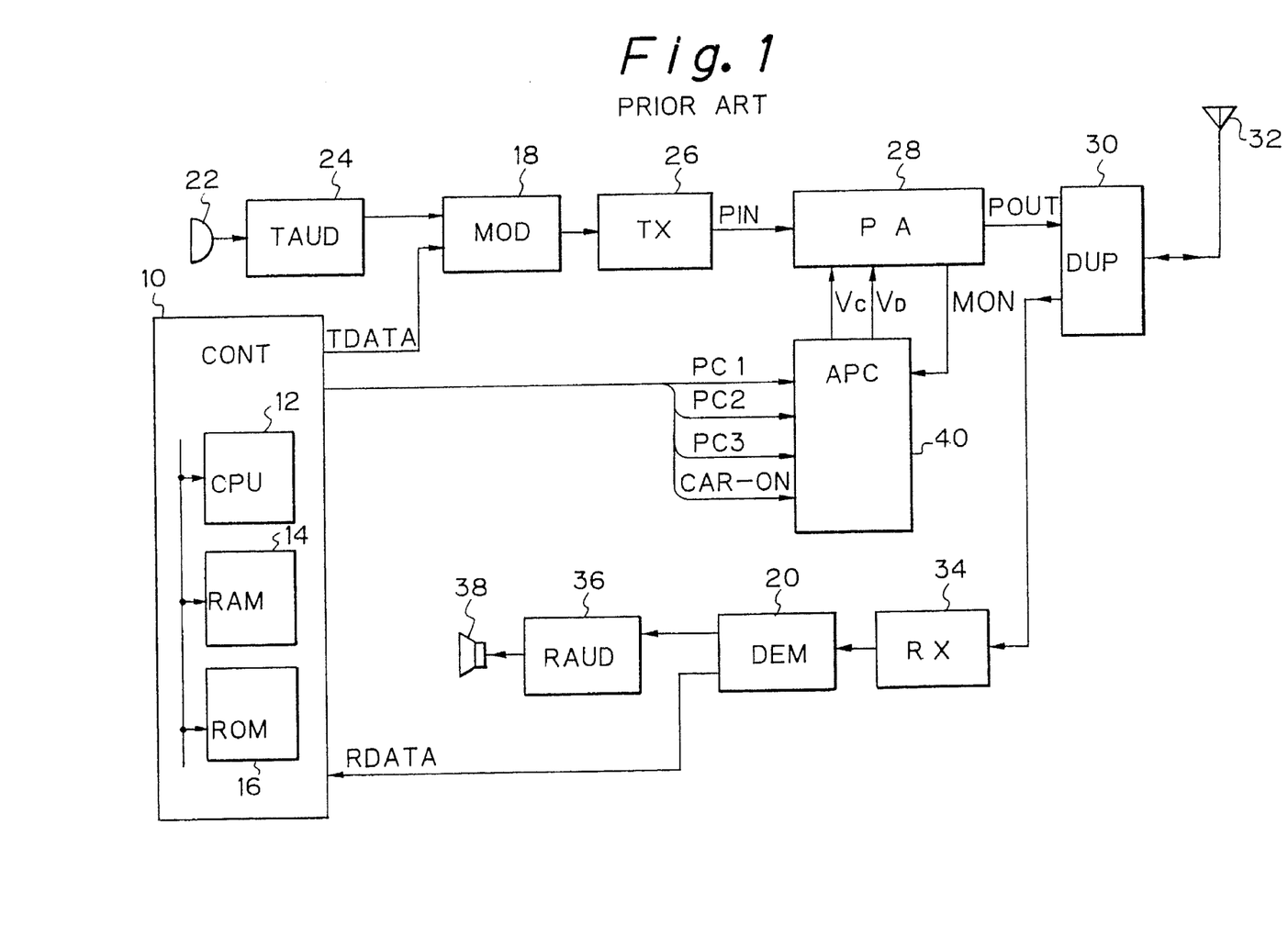
FIG. 1 is a block diagram of a mobile terminal provided with a conventional transmission power control circuit.

FIG. 1 is a block diagram of an example of a mobile terminal provided with a conventional transmission power control circuit.

A control part 10 comprises a central processing unit (CPU) 12, a random access memory (RAM) 14, and a read only memory (ROM) 16.

Transmission data TDATA, which is output from the control part 10 to a modulator 18, and received data RDATA, which is input from a demodulator 20 to the control part 10, are used as control signals to perform operations of "call", "receive", and "registration of place", and they are processed in the control part 10.

During transmission to a base station, an audio signal picked up by a microphone 22 is processed in a transmission audio processing circuit 24, is frequency modulated together with the transmission data TDATA in the modulator 18, and is introduced into a transmitter 26. An output signal of the transmitter 26 is amplified in a power amplifier (PA) 28, whose output signal POUT is transmitted through a duplexer 30 and an antenna 32.

During receiving from the base station, a receiver 34 receives a signal through the antenna 32 and the duplexer 30, and the output signal of the receiver 34 is demodulated in the demodulator 20. An output signal of the demodulator 20 is separated into an audio signal and the received data RDATA, and the audio signal is processed in a receiving audio processing circuit 36 and drives a speaker 38.

The base station issues an instruction to control the transmission power of the mobile terminal in accordance with measured electrical field strength. When the control part 10 in the mobile station receives the instruction included in the received data RDATA, the control part 10 outputs a three bit parallel signal PC1 to PC3 to an automatic power control circuit (APC) 40.

The APC 40 outputs a control voltage $V_C$ to control an amount of amplification of the PA 28 in accordance with the parallel signals PC1 to PC3 and a monitor voltage MON from the PA 28. Additionally the APC 40 supplies source voltage $V_D$ which is switched ON/OFF according to a carrier-on signal CAR-ON from the control part 10, to the PA 28 for ON/OFF control of the transmission carrier.

Figure 2:
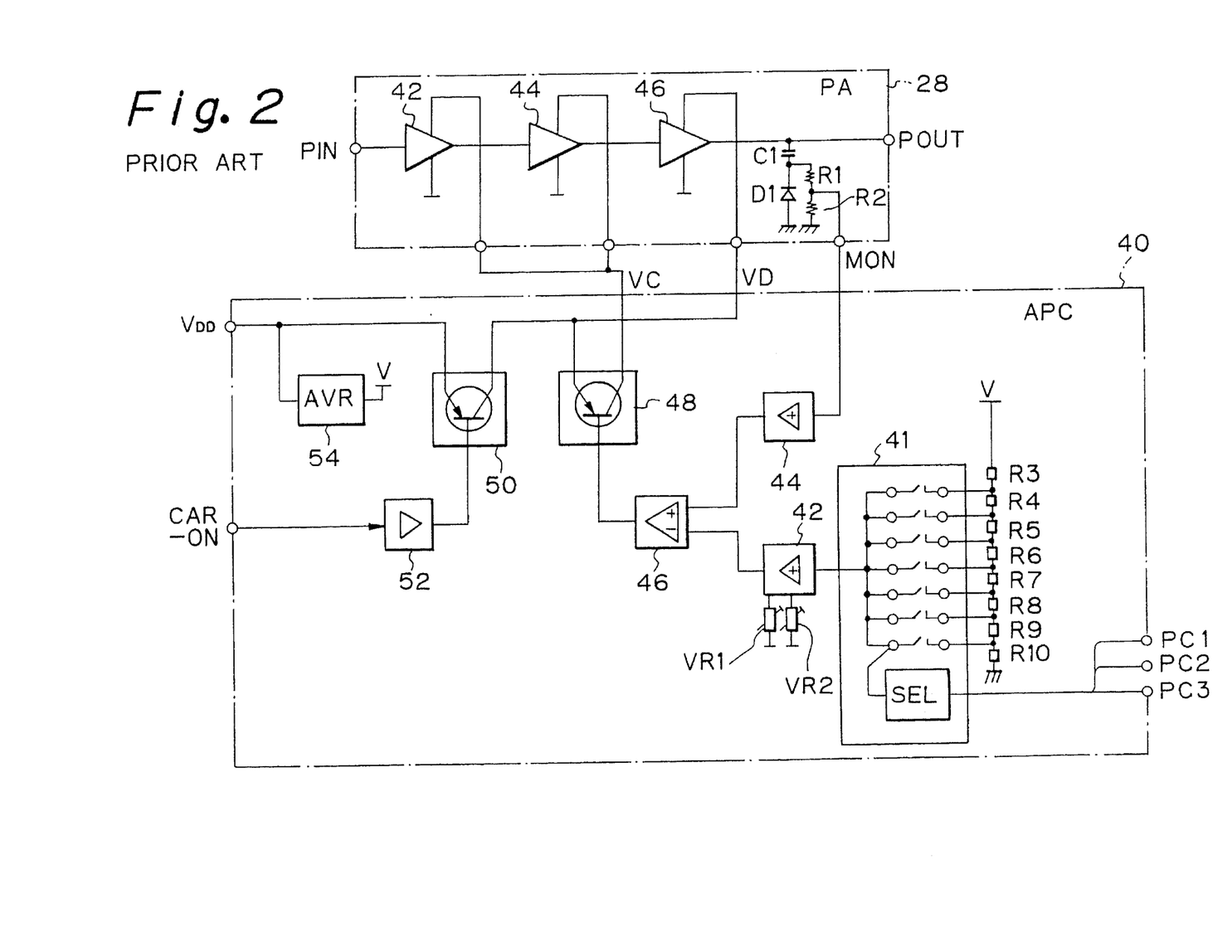
FIG. 2 is a schematic circuit diagram showing a more detailed construction of the PA and APC shown in FIG. 1.

FIG. 2 is a more detailed construction of the PA 28 and the APC 40.

In this example, the PA 28 comprises three serially connected amplifiers 42, 44, and 46. Amplification factors of the amplifiers 42 and 44 are controlled by the control voltage $V_C$. The source voltage $V_D$ is supplied to the third amplifier 46.

A diode D1 detects a level of an output signal of the amplifier 46 through a capacitor C1 and the voltage of the detected signal is divided by resistors R1 and R2 to output the monitor voltage MON to the APC 40.

Resistors R3 to R10 divide the constant-voltage V to derive various voltages. An analog switch 41 selects one of the input terminals to which the various voltages are applied, in accordance with the parallel signals PC1 to PC3. A selected voltage is amplified in an amplifier 42 and input to one input terminal of a differential amplifier 46, as the reference voltage. The minimum value and the maximum value of the reference voltage can be adjusted with variable resistors VR1 and VR2, respectively. The monitor voltage MON is input to another input terminal of the differential amplifier 46 through a buffer amplifier 44. The output voltage of the differential amplifier 46 is applied to a base terminal of a transistor 48, and the control voltage $V_C$ is produced in a collector terminal of the transistor 48. The carrier on signal CAR-ON is applied to a base terminal of a transistor 50 through a buffer amplifier 52. Therefore, while the carrier-on signal CAR-ON is active, the source voltage $V_D$ and the control voltage $V_C$ are supplied to the PA 28. A constant-voltage circuit 54 is provided to derive the constant-voltage V from source voltage $V_{DD}$.

Figure 3:
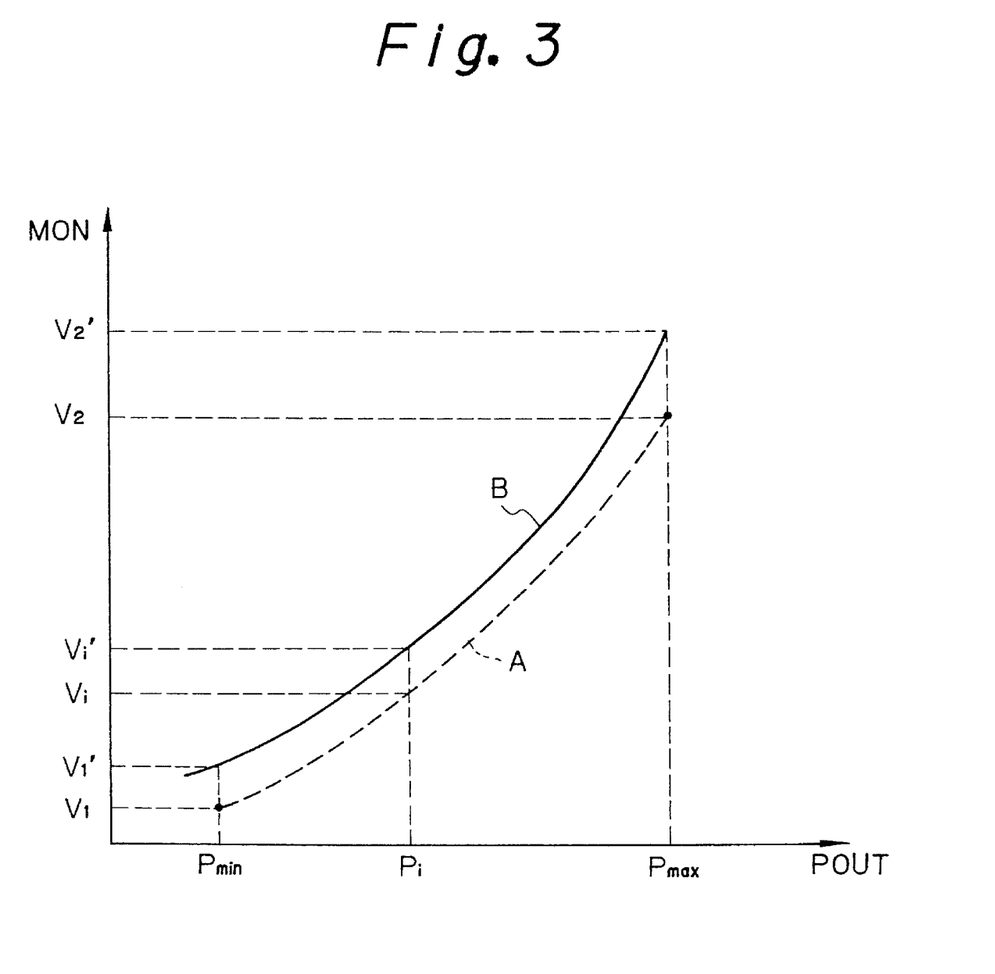
FIG. 3 is a graph of the relationship between the output power of the and the PA monitor voltage.

FIG. 3 is a graph of the relationship between the output power of the PA 28 (POUT) and the monitor voltage (MON), wherein the broken line A denotes standard characteristics and the solid line B denotes characteristics in a certain case. As shown in FIG. 3, the relationship between POUT and MON is non-linear.

If the relationship between POUT and MON in a product coincides with the standard relationship A, $P_{max}$ results by setting the reference voltage to $V_2$, $P_{min}$ results by setting the reference voltage to $V_1$, and $P_i$ results by setting the reference voltage to $V_i$, because the APC 40 operates so that the monitor voltage MON becomes equal to the reference voltage.

On the other hand, if the relationship between POUT and MON is as denoted by B, the reference voltage must be $V_2'$ when $P_{max}$ is required, and the reference voltage must be $V_1'$ when $P_{min}$ is required. Therefore, the reference voltage is adjusted with the variable resistor VR1 and VR2 so as to be $V_2'$ when $V_2$ is selected and to be $V_1'$ when $V_1$ is selected.

In the aforementioned conventional transmission power control circuit, the maximum transmission power $P_{max}$ and the minimum transmission power $P_{min}$ can be exactly adjusted for a specific carrier frequency. However, if the carrier frequency is changed, incorrect transmission power can be transmitted due to frequency dependency of the elements forming the PA 28, especially, the diode D1.

The preferred embodiments of the present invention will now be described with reference to the accompanying drawings.

Figure 4:
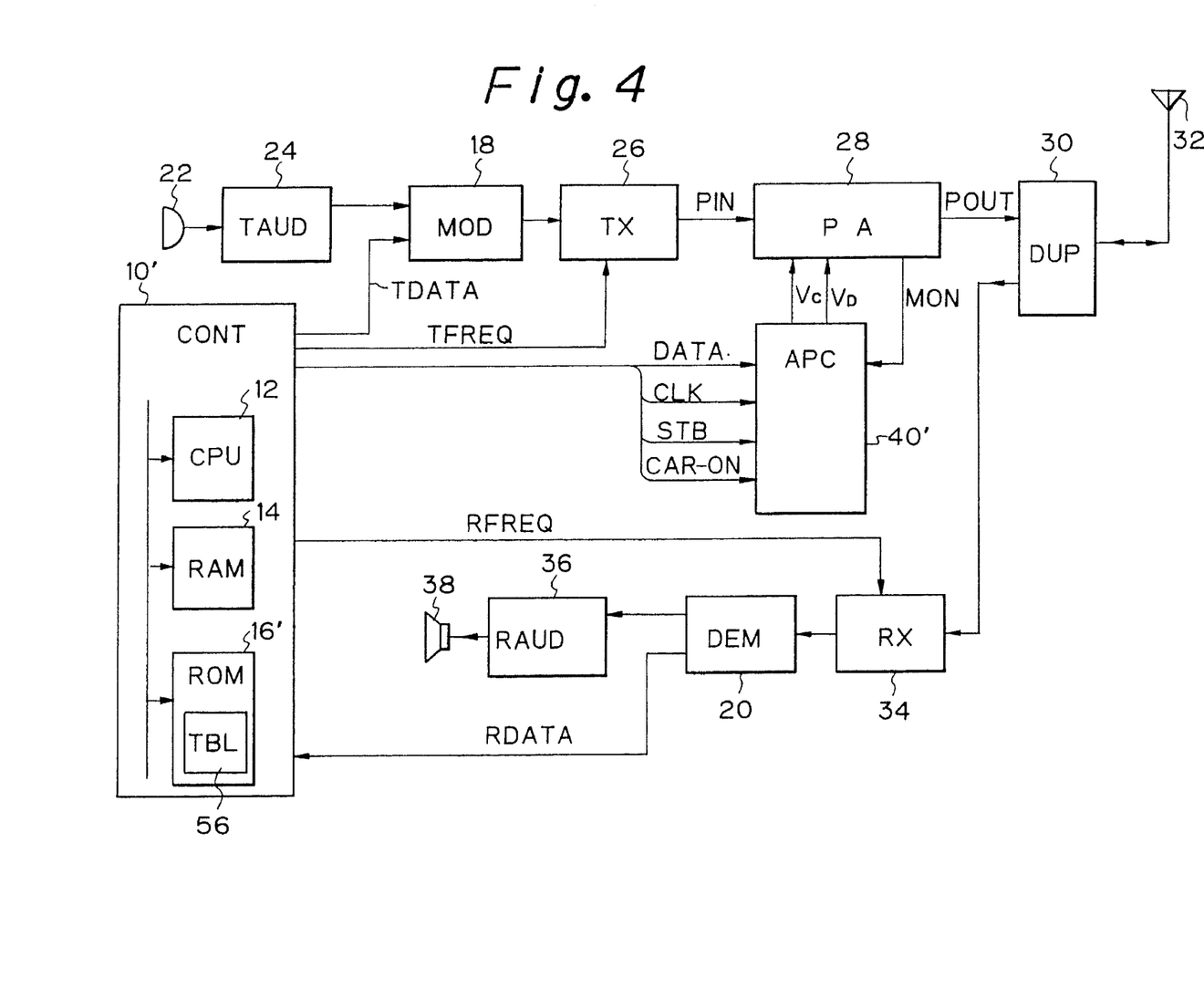
FIG. 4 is a block diagram of a mobile terminal provided with a transmission power control circuit which is a first embodiment according to present invention.
Figure 5:
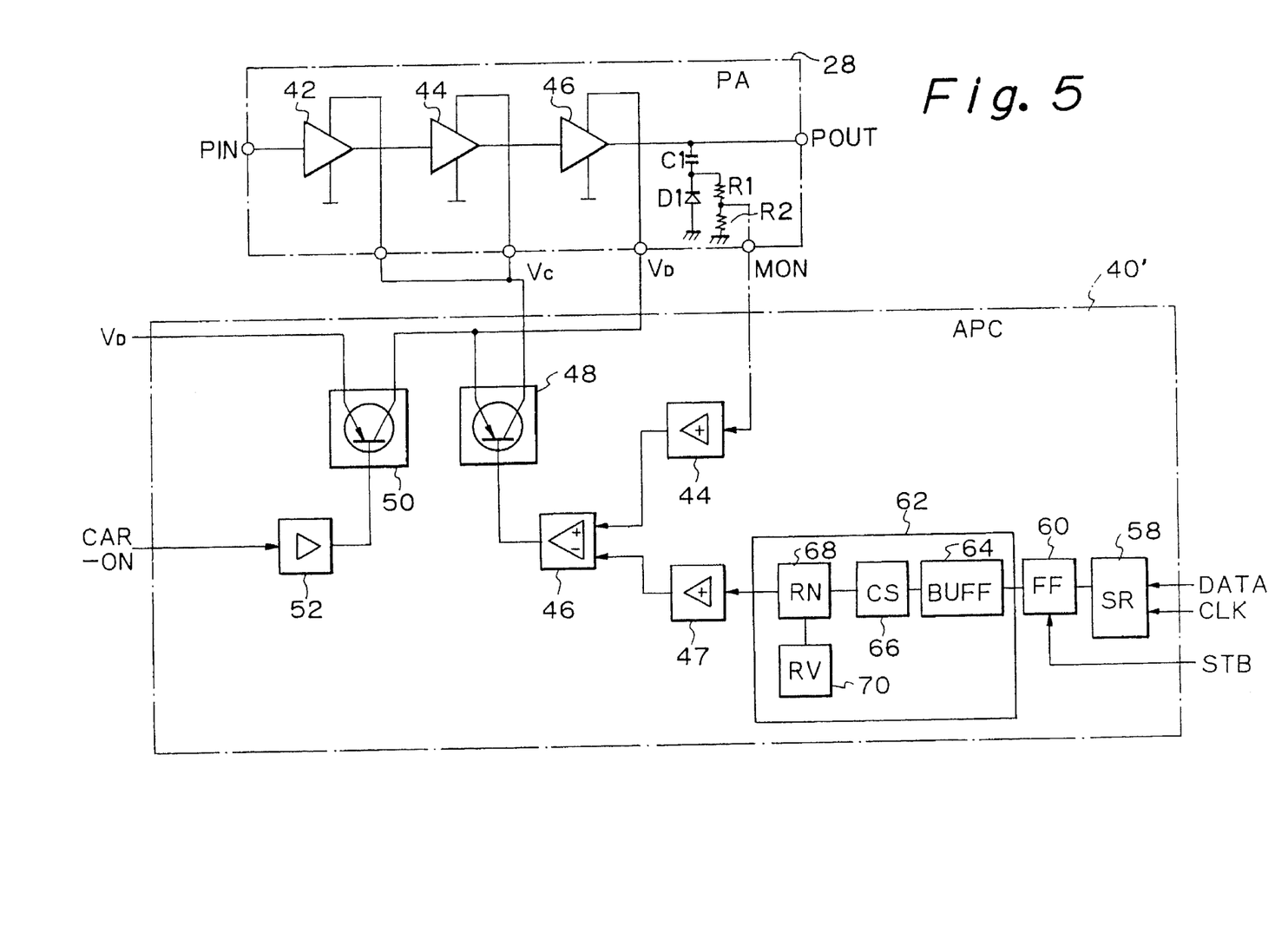
FIG. 5 is a circuit diagram showing a more detailed construction of the PA and the APC shown in FIG. 4.

FIG. 4 is a first embodiment of a mobile terminal provided with a transmission power control circuit according to the present invention. FIG. 5 shows a more detailed construction of an APC 40' shown in FIG. 4. The same reference numerals as used in FIGS. 1 and 2 are used for constituents in FIGS. 4 and 5 which have the same construction as those in FIGS. 1 and 2, and thus descriptions thereof are left out.

Figure 6:
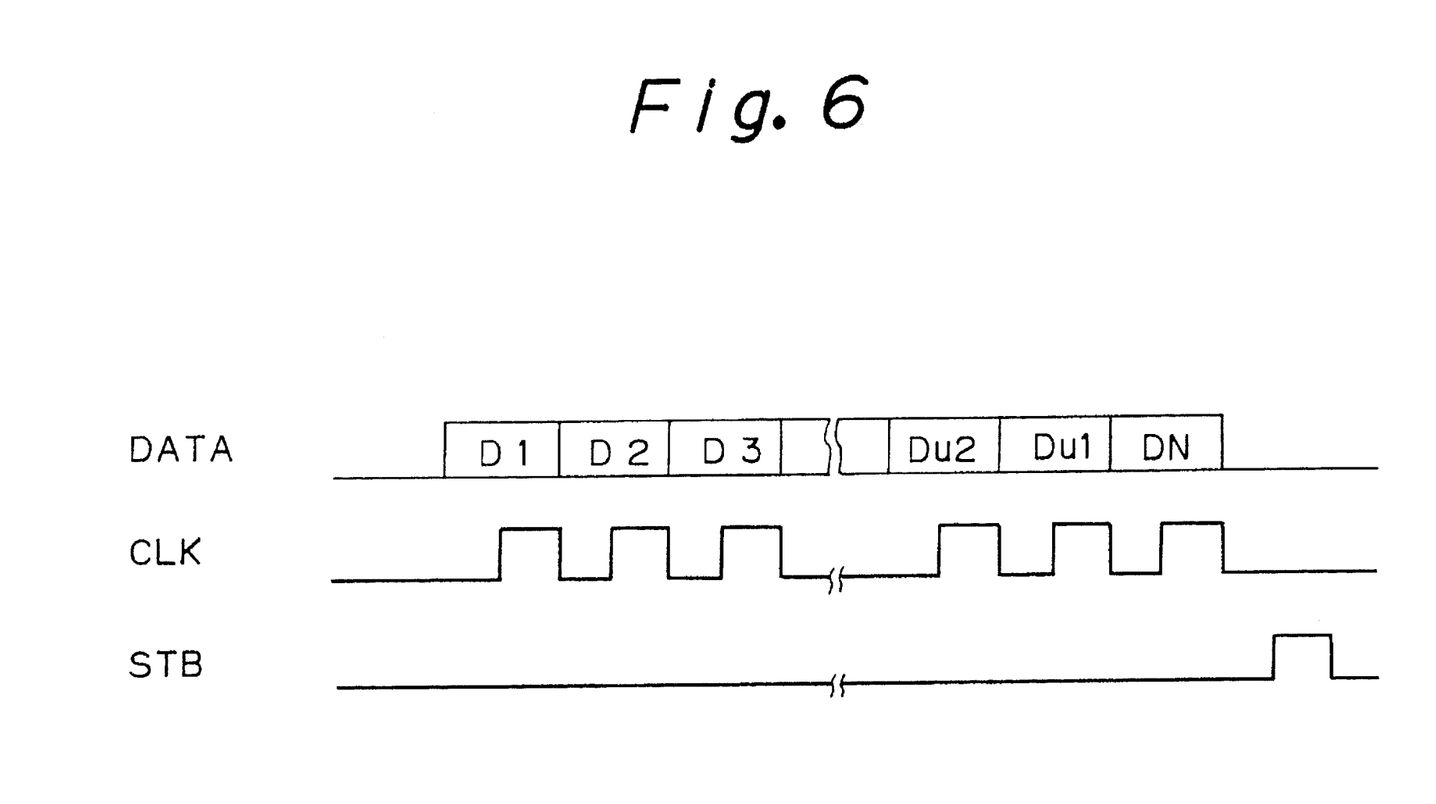
FIG. 6 is a timing chart representing data transferred from the control part to the APC shown in FIG. 4.

Referring to FIG. 4, the control part 10' outputs signals TFREQ and RFREQ to change the carrier frequency of transmission and receiving, respectively, according to an assigned channel during a data transmission mode of operation. An area of a control data table 56 (explained later) is reserved in a ROM 16'. The control part 10' outputs data stored in the control data table 56 in the form of serial data (DATA) together with a clock (CLK) and strobe signal (STB), as shown in FIG. 6.

Referring to FIG. 5, the APC 40' comprises a shift register 58 for storing the serial data synchronizing with the clock, flip-flops 60 for retaining data stored in the shift register 58 when the strobe signal is active, and an D/A converter 62 for converting the data stored in the flip-flops 60 to an analog signal as the reference signal. The reference signal is supplied to one input terminal of the differential amplifier 46 through the amplifier 47. The D/A converter 62 has a well-known construction comprising a buffer 64, a current switch 66, an equivalent resistor network 68, and a constant-voltage circuit 70.

Figure 7:
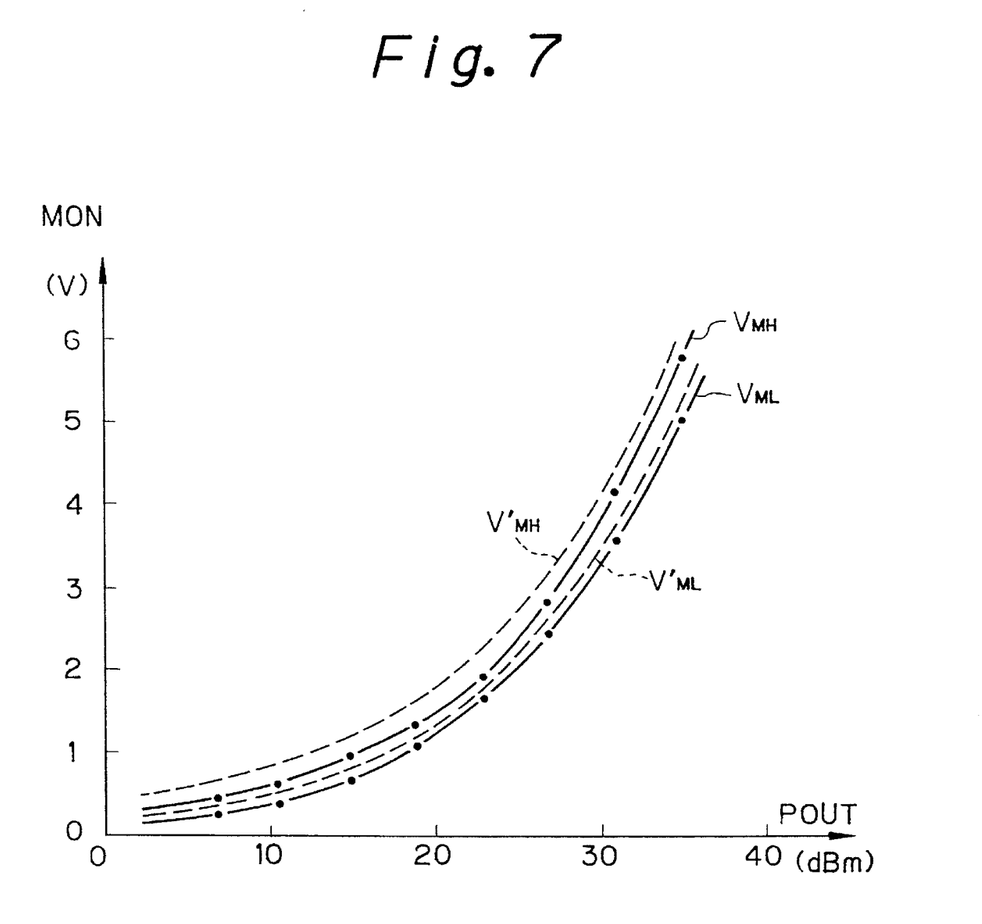
FIG. 7 is a graph of the relationship between the PA and POUT at different carrier frequencies.

FIG. 7 is a graph of the relationship between the monitor voltage MON (V) and the power level of POUT (dBm) under various conditions. The curve $V_{MH}$ represents standard characteristics in the case where the carrier frequency of a transmission wave has a higher typical value, and the curve $V_{ML}$ represents standard characteristics in the case where the carrier frequency of the transmission wave has a lower typical value. Black dots on the curves correspond to eight transmission power levels one of which is selected as an adequate transmission power level. Table I shows numerical values of POUT and MON denoted by the black dots.

TABLE I

| POUT (dBm) | MON (V) | |
| --- | --- | --- |
| | $V_{MH}$ | $V_{ML}$ |
| 34.8 | 5.8 | 5.0 |
| 30.8 | 4.2 | 3.6 |
| 26.8 | 2.8 | 2.4 |
| 22.8 | 1.95 | 1.65 |
| 18.8 | 1.35 | 1.05 |
| 14.8 | 0.95 | 0.17 |
| 10.8 | 0.65 | 0.35 |
| 6.8 | 0.5 | 0.3 |

The values of $V_{MH}$ and $V_{ML}$ as shown in Table I are converted to corresponding digital values, beforehand, and the digital values are stored in the control data table 56 shown in FIG. 4. When the control part 10' receives an instruction to alter the transmission power or the carrier frequency, the CPU 12 reads out an applicable digital value from the control data table 56, in accordance with the values of carrier frequency and the transmission power, to the APC 40' in the form of serial data as shown in FIG. 6. As mentioned previously, the serial data received by the APC 40' is retained in the flip-flops 60 in the form of parallel data. The parallel data is converted into an analog signal in the D/A converter 62 and is supplied to the differential amplifier 46 as a reference signal.

If dispersion among characteristics of the individual elements can be neglected, standard values of $V_{MH}$ and $V_{ML}$ are stored in the control data table 56. If the dispersion cannot be neglected, the values of $V_{MH}$ and $V_{ML}$ are measured for individual products and digital values corresponding to the measured $V_{MH}$ and $V_{ML}$ are stored in the control data table 56, before shipping.

The control data table 56 is made for two typical frequencies in the aforementioned example, but three or more frequencies can be stored. However, a control data table for two or three typical frequencies is preferable.

Figure 8:
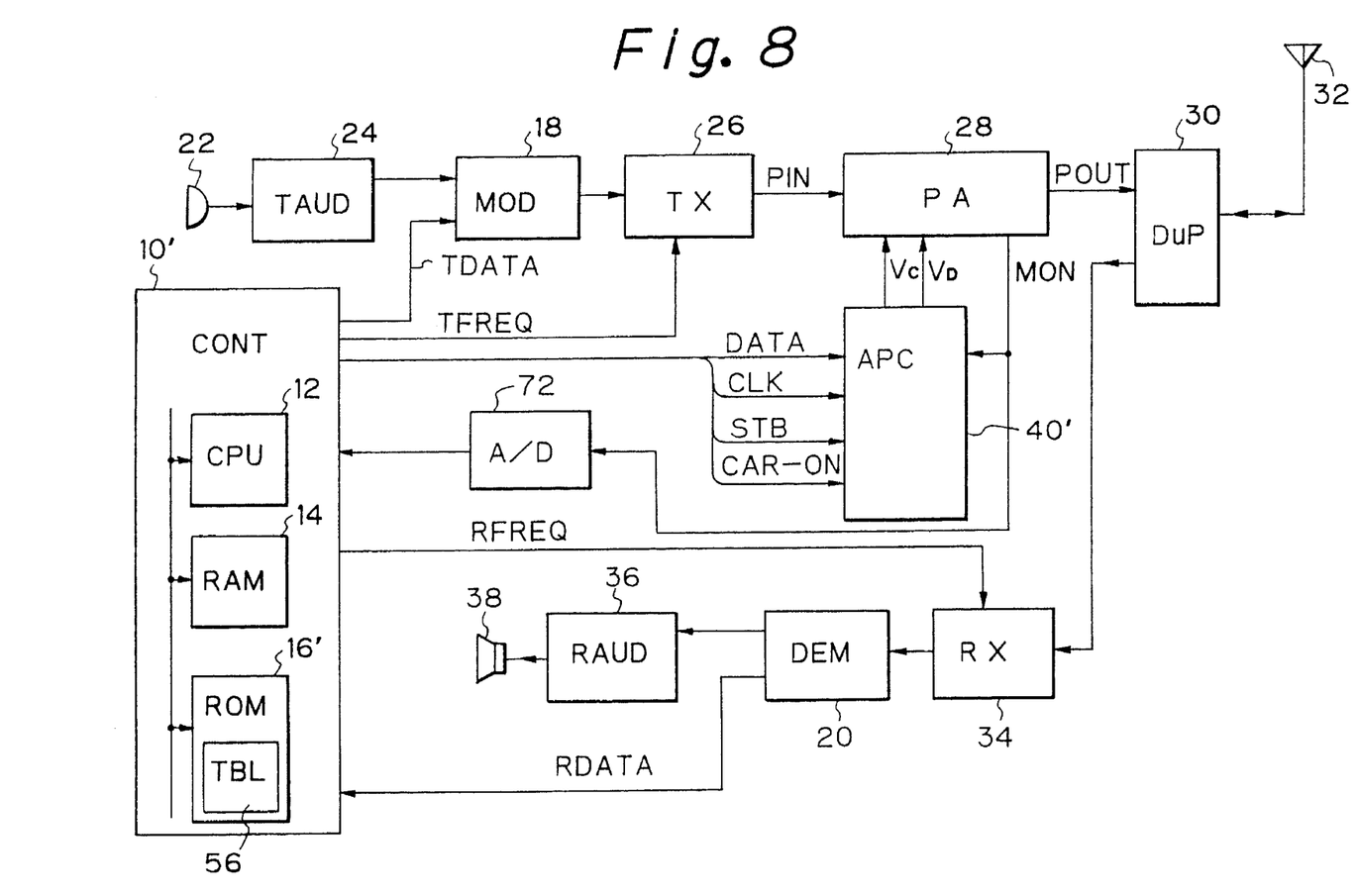
FIG. 8 is a block diagram of a second embodiment according to the present invention.

FIG. 8 is a second embodiment according to the present invention in which the control means is operative in an initialization mode. An A/D converter 72 is provided for automatically measuring the monitor voltage MON at each transmission power level and each frequency value. The control part 10' sequentially alters the transmission power and the carrier frequency, receives the digital value of the monitor voltage as a combination of each transmission power level and each frequency value, and writes the data into the control data table 56 according to a predetermined writing sequence.

Figure 9:
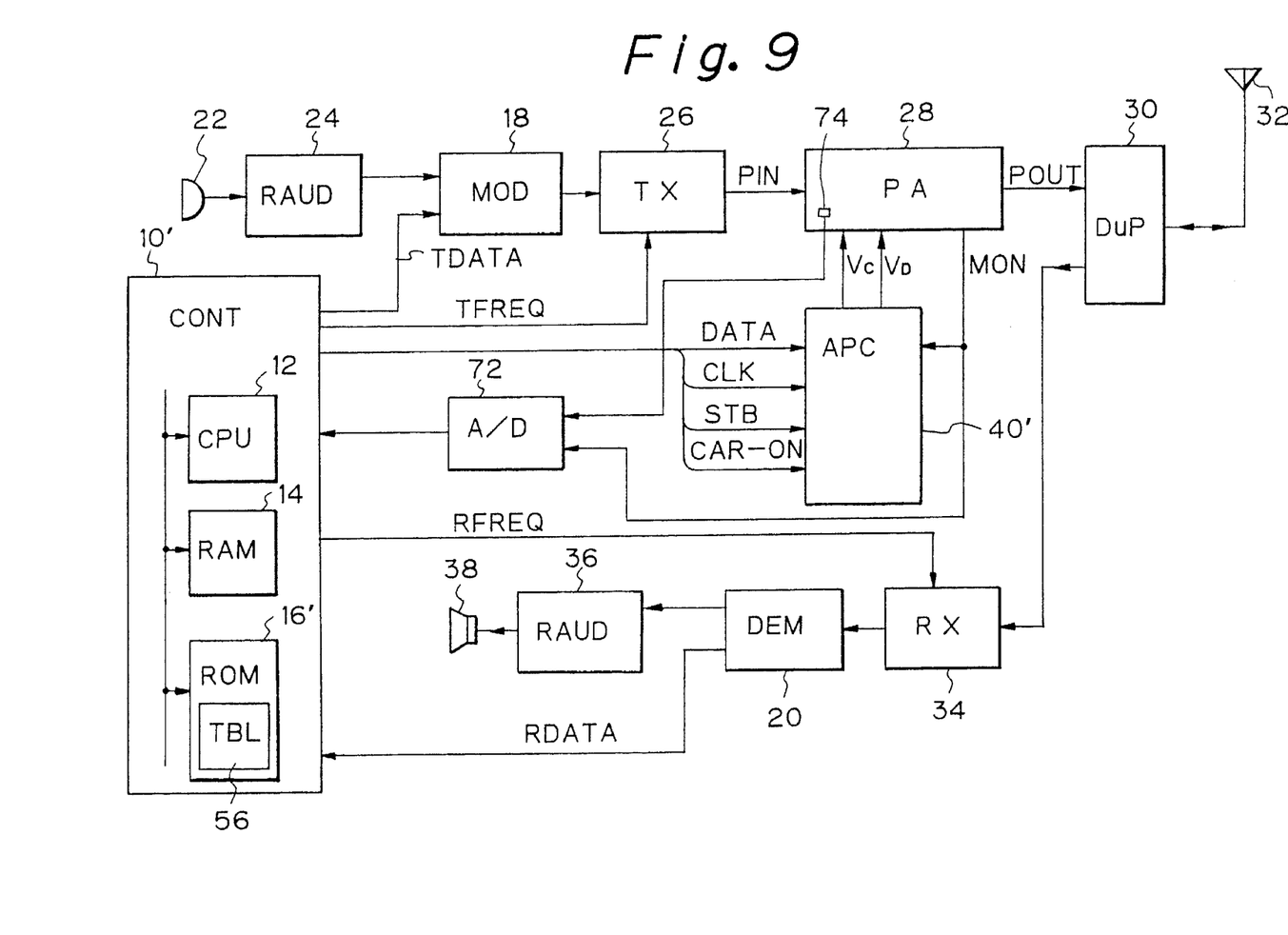
FIG. 9 is a block diagram of a third embodiment according to the present invention.

FIG. 9 is a third embodiment according to the present invention. A temperature sensing element 74 such as, for example, a thermo-couple or a thermistor, is provided for sensing a temperature of the elements within the PA 28. An output signal of the temperature sensing element 74 is also converted in the A/D converter 72, and supplied to the control part 10'. The control part 10' sequentially alters the transmission power and the carrier frequency under several temperature conditions recognized by the digital temperature signal, receives a digital value of the monitor voltage, and writes the data into the control data table 56. Using this control data table 56, compensation for temperature dependency of the characteristics of the elements is also performed.

The foregoing is considered as illustrative only of the principles of the invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention and the appended claims and their equivalents.

The invention claimed is:

1. A transmission power control circuit including a power amplifier, comprising:

an A/D converter;

temperature sensing means for sensing an operating temperature of the power amplifier and producing a sensed temperature analog output signal which is input to said A/D converter and which in turn outputs a corresponding sensed temperature digital signal;

control data table means for storing digital values of corresponding, plural and different analog levels of a monitor voltage output from the power amplifier and representative of respective, plural and different selectable transmission power output levels of transmission signal outputs of the power amplifier, for respective, different transmission frequencies and at each of plural, different operating temperatures of the power amplifier;

control means for selecting one of said digital values stored in said control data table means in accordance with a specified transmission frequency and a specified transmission power output level and at a sensed, current operating temperature as represented by a digital temperature signal output of the temperature sensing means, and for outputting the selected digital value;

D/A conversion means for converting said selected digital value to a reference voltage of the corresponding analog level; and power amplification controlling means for controlling an amplification factor of the power amplifier so that the analog level of the monitor voltage which is output from the power amplifier in monitoring a current transmission signal output becomes equal to the analog level of said reference voltage.

2. A transmission power control circuit as claimed in claim 1 wherein said control means serially outputs the selected digital value, further comprising a serial/parallel converter which converts the selected serial digital value, as output by said control means, to a parallel signal and outputs said parallel signal to said D/A conversion means.

3. A transmission power control circuit including a power amplifier, comprising:

control data table means for storing digital values of corresponding, plural and different analog levels of a monitor voltage output from the power amplifier and representative of respective, plural and different selectable transmission power output levels of transmission signal outputs of the power amplifier, for respective, different transmission frequencies;

control means operative in a data transmission mode for selecting one of said digital values stored in said control data table means in accordance with a specified transmission frequency and a specified transmission power output level, and for outputting the selected digital value;

a D/A convertor which converts said selected digital value to a reference voltage of the corresponding analog level;

power amplification controlling means for controlling an amplification factor of the power amplifier so that the analog level of the monitor voltage which is output from the power amplifier in monitoring a current transmission signal output becomes equal to the analog level of said reference voltage; and an A/D converter means for converting the analog levels of the monitor voltages output from the power amplifier to corresponding digital data, said control means, further, being operative in an initialization mode for altering said transmission power output levels of said power amplifier in correspondence to a selected one of said transmission frequencies, in sequence for all of the plural and different transmission power outputs levels and selectively for all of the plural and different transmission frequencies and, further, receiving said monitor voltage digital data from said A/D conversion means and writing said received, monitor voltage digital data in relation to the respectively corresponding transmission frequency and transmission power output levels, in said sequence, into said control data table means as said digital values.

4. A transmission control circuit as claims in claim 3, wherein said control data table means, further, stores digital temperature signals representing operating temperatures of the power amplifier in relation to the respective, plural and different selectable transmission power output levels of the transmission signal outputs of the power amplifier, further comprising:

an A/D converter;

temperature sensing means for sensing an operating temperature of the power amplifier and producing a sensed analog temperature output signal which is input to said A/D converter and which in turn outputs a corresponding, sensed temperature digital signal; and said control means, further, in said data transmission mode, being responsive to the sensed, current operating temperature represented by a current, sensed temperature digital signal output of the temperature sensing means for selecting the digital value stored in said control data table means in accordance with the specified transmission frequency and specified transmission power output level for the sensed, current operating temperature, thereby to output the selected digital value and, in said initialization mode, being responsive to sensed, current operating temperatures represented by corresponding and current, sensed temperature digital signal outputs of the temperature sensing means for storing and updating said digital temperature signals in said control data table means, representing operating temperatures of the power amplifier, in relation to said respective, plural and different selectable transmission power output levels of the transmission signal outputs of the power amplifier.

5. A transmission power control circuit as claimed in claim 3, wherein said control means serially outputs said selected digital value, and further comprising a said serial/parallel converter which converts said serial digital value output by said control means to a parallel signal and outputs said parallel signal to said D/A conversion means.

6. A transmission control circuit as claims in claim 3, wherein said control data table means, further, stores digital temperature signals representing operating temperatures of the power amplifier in relation to the respective, plural and different selectable transmission power output levels of the transmission signal outputs of the power amplifier, further comprising:

an A/D converter;

temperature sensing means for sensing an operating temperature of the power amplifier and producing a sensed analog temperature output signal which is input to said A/D converter and which in turn outputs a corresponding, sensed temperature digital signal; and said control means, further, being responsive to the sensed, current operating temperature represented by a current, sensed temperature digital signal output of the temperature sensing means for selecting the digital value stored in said control data table means in accordance with the specified transmission frequency and specified transmission power output level for the sensed, current operating temperature, thereby to output the selected digital value.

7. A control circuit which selectively adjusts an amplification factor of a power amplifier and thereby the output power level of a transmission signal output by the power amplifier in accordance with an instruction which is received by the control circuit and which assigns to the transmission signal a specific output power level, of plural and different assignable output power levels, and also a specific transmission carrier frequency, of plural and different assignable transmission carrier frequencies, the power amplifier, further, monitoring a transmission signal currently output thereby and producing and outputting a monitor signal, the monitor signals for different, monitored transmission signals comprising analog voltages of different voltage levels, proportional to the respective, different power output levels thereof and varying as a function of the respective, different transmission carrier frequencies thereof, the control circuit comprising:

a memory storing digital data corresponding to the respective analog voltage levels of the respective monitor signals output by the power amplifier for each of the plural and different assignable power output levels, of each of the plural and different assignable transmission carrier frequencies, of each of the transmission signals which may be output by the power amplifier under control of the control circuit;

a controller which, in response to a control instruction received for a current transmission signal, selectively reads, from the memory, the corresponding digital data representing the analog voltage level of the monitor signal as would be output by the power amplifier monitoring the current transmission signal when output thereby at the assigned transmission power output level and the assigned transmission carrier frequency, and which outputs the selectively read digital data as reference digital data;

a digital to analog converter which receives, and converts, the reference digital data output by the controller for the current transmission signal output to an analog reference voltage output; and a power amplification control circuit which receives and compares the respective analog voltage levels of the analog reference voltage output of the digital to analog converter with the analog monitor voltage output of the power amplifier and produces a comparator output signal representing any difference therebetween and which supplies the comparator output signal, as a power amplification factor control signal, to the power amplifier for selectively controlling the amplification factor thereof so as to output from the power amplifier the current transmission signal at the output power level assigned thereto by the control instruction.

8. A transmission power control circuit as claimed in claim 7, wherein said control means serially outputs said selected digital value, and further comprising a said serial/parallel converter which converts said serial digital value output by said control means to a parallel signal and outputs said parallel signal to said D/A conversion means.

* * * * *

UNITED STATES PATENT AND TRADEMARK OFFICE
CERTIFICATE OF CORRECTION

PATENT NO. : 5,603,106
DATED : Feb. 11, 1997
INVENTOR(S) : TODA

It is certified that error appears in the above-indentified patent and that said Letters Patent is hereby corrected as shown below:

Col. 1, line 66, change "power" to --powers--.

Col. 2, line 33, change "and the PA" to --PA and the--;
line 36, after "according to" insert --the--.

Col. 4, line 28, change "shows" to --is--.

Signed and Sealed this

Twenty-fourth Day of June, 1997

Attest:

BRUCE LEHMAN

Attesting Officer

Commissioner of Patents and Trademarks